(12) United States Patent
Gopalakrishnan et al.

(10) Patent No.: US 8,584,072 B1
(45) Date of Patent: Nov. 12, 2013

(54) TECHNIQUE FOR MODELING PARASITICS FROM LAYOUT DURING CIRCUIT DESIGN AND FOR PARASITIC AWARE CIRCUIT DESIGN USING MODES OF VARYING ACCURACY

(75) Inventors: Prakash Gopalakrishnan, Allison Park, PA (US); Rongchang Yan, New Kensington, PA (US); Akshat H. Shah, Pittsburgh, PA (US); David N. Dixon, Allison Park, PA (US); Keith Dennison, Edinburgh (GB)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 13/601,757

(22) Filed: Aug. 31, 2012

Related U.S. Application Data

(62) Division of application No. 12/243,394, filed on Oct. 1, 2008, now Pat. No. 8,261,228.

(51) Int. Cl.
*G06F 17/50* (2006.01)

(52) U.S. Cl.
USPC ............ 716/132; 716/111; 716/115; 716/136

(58) Field of Classification Search
USPC .................................. 716/111, 115, 132, 136
See application file for complete search history.

(56) References Cited

U.S. PATENT DOCUMENTS

| | | | |
|---|---|---|---|
| 5,463,563 A | 10/1995 | Bair et al. | |
| 5,467,291 A * | 11/1995 | Fan et al. | ......................... 703/14 |
| 5,787,268 A | 7/1998 | Sugiyama et al. | |
| 5,999,726 A | 12/1999 | Ho | |
| 6,106,567 A | 8/2000 | Grobman et al. | |
| 7,093,206 B2 * | 8/2006 | Anand et al. | ................... 716/115 |
| 7,149,666 B2 | 12/2006 | Tsang et al. | |
| 7,203,629 B2 | 4/2007 | Ozis et al. | |
| 7,206,731 B2 | 4/2007 | Sercu et al. | |
| 7,302,672 B2 * | 11/2007 | Pack et al. | .......................... 430/5 |
| 7,328,195 B2 | 2/2008 | Willis et al. | |
| 7,539,961 B2 | 5/2009 | Dengi et al. | |
| 7,735,048 B1 | 6/2010 | Zhang et al. | |
| 8,209,650 B2 * | 6/2012 | St. John et al. | ................ 716/111 |
| 8,261,228 B1 | 9/2012 | Gopalakrishnan et al. | |
| 2003/0154061 A1 | 8/2003 | Wilils | |
| 2004/0158805 A1 | 8/2004 | Kanamoto et al. | |
| 2005/0240883 A1 | 10/2005 | Huang et al. | |
| 2008/0028352 A1 | 1/2008 | Birch et al. | |
| 2008/0092099 A1 | 4/2008 | Lin et al. | |
| 2008/0195988 A1 | 8/2008 | Goren et al. | |
| 2009/0228847 A1 | 9/2009 | Suaya | |
| 2010/0070934 A1 | 3/2010 | Tan et al. | |

OTHER PUBLICATIONS

"U.S. Appl. No. 12/243,394, Final Office Action mailed Jun. 27, 2011", 6 pgs.

(Continued)

*Primary Examiner* — Naum Levin

(74) *Attorney, Agent, or Firm* — Schwegman Lundberg & Woessner, P.A.

(57) ABSTRACT

A user is presented with a simulation environment within which the user is provided a choice to select between parasitic simulation modes of varying accuracy, the modes including a mode without parasitics and a plurality of modes including parasitics with a varying degree of accuracy. A selection from among the modes is received from the user and simulation test are performed at the selected degree of accuracy.

17 Claims, 8 Drawing Sheets

(56) References Cited

OTHER PUBLICATIONS

"U.S. Appl. No. 12/243,394, Non Final Office Action mailed Feb. 4, 2011", 17 pgs.

"U.S. Appl. No. 12/243,394, Notice of Allowance mailed May 3, 2012", 9 pgs.

"U.S. Appl. No. 12/243,394, Response filed Jan. 3, 2011 to Restriction Requirement mailed Nov. 3, 2010", 6 pgs.

"U.S. Appl. No. 12/243,394, Response filed May 4, 2011 to Non Final Office Action mailed Feb. 4, 2011", 9 pgs.

"U.S. Appl. No. 12/243,394, Restriction Requirement mailed Nov. 3, 2010", 7 pgs.

"U.S. Appl. No. 13/601,635 Response filed Jun. 3, 2013 to Non-Final Office Action mailed Mar. 1, 2013", 8 pgs.

"U.S. Appl. No. 13/601,635, Examiner Interview Summary mailed May 7, 2013", 3 pgs.

"U.S. Appl. No. 13/601,635, Non Final Office Action mailed Mar. 1, 2013", 9 pgs.

"U.S. Appl. No. 13/601,635, Notice of Allowance mailed Jun. 17, 2013", 9 pgs.

Birrer, Patrick, et al., "Schematic-Driven Substrate Noise Coupling Analysis in Mixed-Signal IC Designs", IEEE Transactions on Cirfcuits and Systems—I: Regular Papers, vol. 33, No. 12, (Dec. 2006), 10 pgs.

\* cited by examiner

TECHNIQUE FOR MODELING PARASITICS FROM LAYOUT DURING CIRCUIT DESIGN AND FOR PARASITIC AWARE CIRCUIT DESIGN USING MODES OF VARYING ACCURACY

CLAIM OF PRIORITY

This application is a divisional of and claims the benefit of priority under 35 U.S.C. §120 to U.S. Pat. No. 8,261,228, filed on Oct. 1, 2008, and issued Sep. 4, 2012, which is hereby incorporated by reference herein in its entirety.

BACKGROUND OF THE INVENTION

1. Field of Invention

This invention relates generally to techniques for treating parasitics in the design of integrated circuits. More specifically, it presents techniques that allow the design process to be aware of parasitics with varying degree of accuracy and also techniques allowing parasitics to be modeled during circuit design from the layout.

2. Description of Related Art

Radio frequency (RF) and High-Performance Analog designs are extremely sensitive to layout parasitic effects. With increased manufacturability challenges and aggressive performance goals, these parasitic effects are preferably taken into account early in the design cycle, during the circuit sizing and optimization process.

In a typical analog and mixed signal design methodology, the designer starts by designing the circuit in the absence of parasitics. At this point, the simulation tests point to the original schematic. Once the simulation outputs meet the expected goals, the designer proceeds to take parasitics into account. For most analog and mixed-signal designs, it is typically enough to estimate some of these parasitics on the schematic itself, manually. This is achieved by inserting some dummy parasitic elements into the schematic and analyzing the impact of these parasitics on the circuit performance. Once the schematic design meets design goals in the presence of simplistic schematic parasitic estimates, the design is handed off for layout. The parasitics are extracted from the finished layout using extraction tools. The extracted view is then used for a parasitic re-simulation flow that allows the verification of design goals post extraction.

Since RF and high-performance analog designs however are extremely sensitive to layout parasitics, the typical analog/mixed-signal methodology described above falls short because the final extracted design may not meet the design specifications and will often require a re-design and re-layout. As a result, there is a need for mechanisms to analyze the effects of parasitics early in the design flow, during the circuit simulation, circuit sizing and optimization.

Additionally, the electrical behavior of RF and high-performance analog designs is increasingly being affected by layout intricacies, forcing designers to account for these effects early in the design cycle. As current analog/mixed-signal design flows are mostly manual, relying on separate front-end design by a designer, who sizes the circuit schematic to meet performance goals, followed by hand-off to a layout engineer who places and routes the design. For most designs, the circuit may not meet all the specifications in the presence of layout parasitics, which are only detected after layout extraction, once the layout is complete. This makes it necessary to iterate multiple times between sizing and layout.

To mitigate this problem, designers need to account for parasitics early in the design cycle, during circuit design and layout.

The existing approaches to estimate parasitics early in the design have been mostly manual and limited to parasitic estimation on the schematic. In some cases, the designer can manually enter RC estimate values for star-shaped net parasitic models. The designer can then simulate the circuit using predefined tests and compare the results from simulations with parasitics with that from simulations without parasitics. This approach is limited to analyzing parasitics estimated on the schematic. It does not offer any support for fetching parasitic information from layouts or partial layouts.

In other cases, the designer can extract parasitics from a layout using an extraction tool. The extracted view can then be used for parasitic re-simulation. For this approach, the layout needs to be completed and fully extracted using extraction tools. This is a time-consuming process. Further, the designers optimizing the circuit may not have all the skills to fully complete a layout and extract it, making this flow more cumbersome. Hence, there is a need for mechanisms that allow the designer to estimate parasitics from a layout, as the layout is being created, including parasitics from a partial layout. Further, none of these existing approaches allow the designer to mix-and-match schematic parasitic information with layout parasitic information.

With respect to the existing approaches to analyzing parasitics early in the design, these are mostly manual. The designer first simulates the circuit design without parasitics and saves the results from the simulation. The designer then inserts some dummy parasitic elements into the circuit schematic and simulates the circuit to analyze the impact of these parasitics on the circuit performance. The designer can then compare the results from simulations with parasitics with that from simulations without parasitics. When parasitics affect the circuit performance, the designer changes some of the sizes of the circuit elements to compensate for the presence of parasitics. However, sometimes when the design cannot meet the required performance targets, the designer might need to change the original circuit topology to achieve the desired performance goals and repeat the parasitic analysis steps. However, this process is typically very cumbersome and error-prone.

The described manual approach to perform parasitic analysis early in the design process is very cumbersome and error-prone. Since the designer has to manually insert dummy parasitics into the circuit schematic, it is very difficult to switch back-and-forth between these analyses types during the circuit design process and compare the results of simulations without parasitics with those of simulations.

SUMMARY OF INVENTION

Techniques are presented for accounting for parasitics in the automated design of integrated circuits. In a first set of aspects, model values for parasitic models are received on a schematic environment from a user, the parasitic models are evaluated from the schematic using the received model values, the parasitic models are transferred to a layout environment, and the transferred parasitic models are evaluated on the layout environment.

According to other aspects, model values are received for parasitic models from a user, the parasitic models are evaluated on the layout environment, and the process then backannotates the parasitic models evaluated on the layout environment and corresponding parameter values to a schematic environment.

In a further set of aspects, a user is presented with a simulation environment within which the user is provided a choice to select between parasitic simulation modes of varying accuracy, the modes including a mode without parasitics and a plurality of modes including parasitics with a varying degree of accuracy. A selection from among the modes is received from the user and simulation test are performed at the selected degree of accuracy.

Various aspects, advantages, features and embodiments of the present invention are included in the following description of exemplary examples thereof, which description should be taken in conjunction with the accompanying drawings.

DRAWINGS

DETAILED DESCRIPTION

Overview

Figure 1:
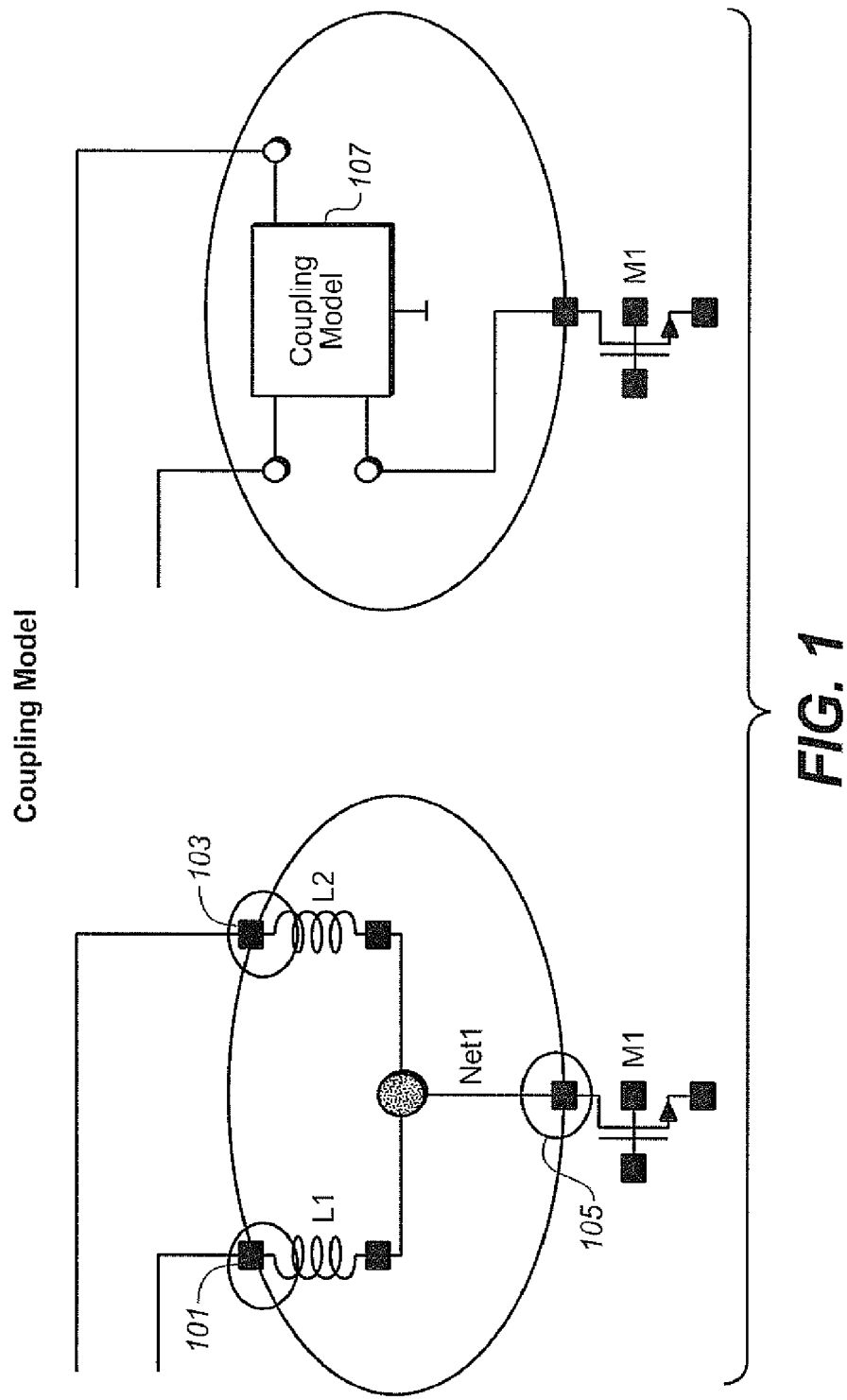
FIG. 1 shows a coupling model example.

As discussed in the Background, the electrical behavior of RF (radio frequency) and high-performance analog designs is increasingly being affected by layout intricacies that force designers to account for these effects early in the design cycle. Current analog/mixed-signal design flows are largely manual, relying on separate front-end design by a designer, who sizes the circuit schematic to meet performance goals, followed by hand-off to a layout engineer who places and routes the design. For most designs, the circuit may not meet all the specifications in the presence of layout parasitics, which are only detected after layout extraction once the layout is complete, resulting in multiple iterations between sizing and layout. To mitigate this problem, designers need to account for parasitics early in the design cycle, during circuit design and layout.

While some early estimation of parasitics is possible by using simplistic equation-based approximation techniques, for critical analog and RF circuits, designers need mechanisms to fetch parasitic information from the layout.

For RF and high-performance analog designs, very often layout creation and circuit design steps happen simultaneously. Designers might create parts of the layouts and study the impact of parasitics from those parts on the design. Consequently, there is a need for capabilities to analyze parasitic effects from such partial layouts.

The designer might first identify critical nets and devices on the schematic and estimate parasitics using simplistic equation based techniques; however, as parts of the layout are available, the designer might want to get more detailed information from the layout. There is therefore a need for capabilities to use the information identified on the schematic to drive the estimation of parasitics from the layout.

The designer might estimate parasitics for certain nets by using simplistic equation based approximation techniques, while using more detailed parasitic information from the layout for other design elements. Consequently, there is a need for mechanisms to mix-and-match schematic parasitic information with detailed layout parasitic information.

To help address the shortcomings of current approaches, various aspects of the embodiments presented below use parasitic models, model evaluation from layout, backannotation of models from layout, or combinations of these.

With respect to parasitic models, according to one set of aspects, modeling capabilities are presented that offer varying levels of accuracy for parasitic models for nets, as well as coupling between nets and instances. In addition to allowing the user to enter values of model parameters manually on the schematic, this capability allows them to evaluate them from the layout. The models are represented using design annotations made up of:

Model Members: the design elements that are represented by the Model and the connections to those models.

Model Parameters: Model parameters describe attributes of the model, for example, whether they are evaluated on the schematic or on from the layout.

Member Parameters: Member parameters are used to describe attributes of the connections to the model.

In model evaluation from layout, schematic parasitic models are evaluated on the schematic, by the user manually entering the values for these models. Layout parasitic models are however evaluated from the layout, using evaluation tools. Layout parasitic models are transferred from the schematic to the layout. Once the models are available on the layout, model evaluation is performed using evaluation tools that evaluate the values of various model parameters from the layout. Different models can have different evaluation tools based on the type of model and the type of accuracy needed.

For backannotation of models from layout, once the models are evaluated, they are backannotated to the schematic, along with the values for the parameters. This approach permits the designer to mix and match models evaluated on the layout with those evaluated on the schematic. The designers can backannotate models from partial layouts to the schematic. They are not limited to a single layout; instead they can mix and match parts of layouts from multiple layout sources to the same schematic. Further, schematic parasitic models, originally evaluated on the schematic can also be converted to layout models, transferred to the layout, evaluated on the layout and then backannotated back to the schematic. The backannotation of models from layout can be used with the model evaluation from layout or separately.

These techniques provide a number of advantages of previous approaches. For example, these techniques allow designers to fetch parasitic information from the layout during the circuit design process, thereby not being limited to simple equation based approximation techniques for parasitic estimation on the schematic. Another advantage is that the technique is not limited to full/complete layouts, but can backannotate models from partial layouts to the schematic. Thus, they are not limited to completing the layout and performing a full extraction followed by a parasitic re-simulation; further, they can mix and match parts of layout information from multiple layout sources to the same schematic. A further advantage is that the schematic parasitic models, originally evaluated on the schematic, can also be converted to layout models, transferred to the layout, evaluated on the layout and then backannotated back to the schematic. This ability permits the designer to first identify critical nets and devices on the schematic and estimate parasitics using simplistic equation based techniques. Then, as parts of the layout are available, the designer can get more detailed information from the layout. Thus, the designer is able to use the information identified on the schematic to drive the estimation of parasitics from the layout. Additionally, these techniques permit designers to mix-and-match schematic parasitic information with detailed layout parasitic information, allowing them to estimate parasitics for certain nets by using simplistic equation based approximation techniques, while using more detailed parasitic information from the layout for other design elements.

As also discussed in the Background, since the RF and high-performance analog designs however are extremely sensitive to layout parasitics, the typical analog/mixed-signal methodology described above falls short because the final extracted design may not meet the design specifications and will often require a re-design and re-layout. As a result, there is a need for mechanisms to analyze the effects of parasitics early in the design flow, during the circuit simulation, circuit sizing and optimization. With respect to a need for mechanisms to analyze the effects of parasitics early in the design flow during the circuit simulation, circuit sizing and optimization, these include a way to analyze the trade-offs due to the impact of parasitics of varying levels of accuracy; for example, parasitic information estimated using simple equations or parasitic information extracted from previous layouts of similar designs. Designers need ways to easily switch back-and-forth between these analyses of varying accuracy and compare the results of simulations without parasitics with those of simulations with parasitics of varying levels of accuracy. There is also a need to analyze the impact of ranges of parasitic values on the circuit performance. Such information can be used for analyzing the sensitivity of the circuit to the parasitic values as well as to make the design robust across multiple parasitic values. We also need ways to find suitable values for Parasitics that result in optimal circuit specification, within a given range of values.

To help address the shortcomings of current approaches, various aspects presented below can include the following:

A Parasitics Mode Toolbar is made available in the simulation environment. Users can easily switch back-and-forth between these analysis types of varying accuracy during the circuit design process and compare the results of simulations without parasitics with those of simulations with parasitics of varying types of accuracy. The following are examples of the various modes:

None: In this mode, the circuit is simulated without parasitics. The results from these simulations can be used to compare with those from simulations with parasitics to analyze the impact of parasitics on the circuit performance.

Schematic Estimates: Early in the design cycle, parasitic estimate values may be generated by the user on the schematic, for example, using equation-based approximation techniques. This mode is similar to what is done for analog designs in earlier approaches.

Extracted: This mode is used when information about the parasitics can be extracted from a layout. Early in the design cycle, such information can be extracted from layout previously completed on similar designs.

When the user switches modes, the tests in the simulation environment are automatically converted to point to the parasitic simulation views. For the Schematic Estimates Mode, this capability can automatically build an estimated view that is a flattened version of the original hierarchical schematic with critical nets replaced by parasitics elements. For the Extracted Mode, this can switch the tests to the extracted view, which already contains the parasitic elements extracted from a previously created layout.

Mode switching takes care of mapping device parameters from the schematic to estimated views. This ability makes it possible to sweep device parameters in the presence of estimated parasitics.

A new category of parameters in the simulation environment is introduced that will allow parasitic model parameters to be swept. These simulation parameters are created automatically when building an estimated view. There is a one-to-one correspondence between the simulation parameters and the parasitic model parameters. In addition to scalar values for these parameters, users can specify a range using the same syntax as device parameters. When running the simulations in schematic estimates modes, users have a choice of sweeping design parameters, parasitic parameters, or both. Outside the estimates modes parasitic parameters are disabled and only device parameters can be swept.

User can explicitly match estimates on or between different nets, and these can all be swept and optimized together.

These abilities provide a number of advantages over the existing approaches. Providing a mode toolbar directly in the simulation environment makes it very easy for the designer to readily switch back-and-forth between analyses types during the circuit design process and compare the results of simulations without parasitics with those of simulations with parasitics of varying levels of accuracy, making it very easy to analyze the trade-offs due to the impact of parasitics of varying levels of accuracy: those obtained from simple estimation equations and those extracted from previous layouts of similar designs. Additionally, by automating the process of creating estimated views and switching test configurations/bindings, this process can be made less error-prone for the designer and very easy to use, allowing the designer to focus on more critical aspects of the circuit design process, rather than worrying about mundane bookkeeping. Further, device parameters are mapped between schematic and estimated views when switching modes, allowing users to sweep device parameters in the presence of parasitics. Additionally, by introducing the parasitic parameters in the simulation environment, the techniques given here provide the capability for sweeping design parameters, parasitic parameters, or both, which makes it very easy to analyze the sensitivity of the circuit to the parasitic values as well as to make the design robust across multiple parasitic values. The circuit Can also be optimized to find suitable values for Parasitic Parameters that result in optimal circuit specification. Also, it is easier for the user to match estimates on or between different nets such that they are all swept optimized together, which is more convenient than current methods where users had to create global variables corresponding to each set of matched estimates.

Parasitic Models

The parasitic modeling capabilities presented here offer varying levels of accuracy for parasitic models for nets as well as coupling between nets and instances. FIG. 1 shows an example of a coupling model that models the parasitic coupling interactions between multiple nets and instances. In the example, the coupling between an inductance L1 101 and an inductance L2 103, which are connected to the transistor M1 105, are replaced by the coupling model 107. The models are represented using design annotations made up of Model Members, Model Parameters and Member Parameters. The details of the model representation is now described.

Parasitic Model Members

Members are the design elements that are represented by the model and the connections to those models. For a Net Model, for example, the members would be the net that is replaced by the model and the terminals on the net that connect to the instances ("inst-Terms"). For a Coupling Model, these would be all the instances and nets replaced by the coupling model, along with the inst-Terms that represent the ports of the model. For example, for the Coupling Model from FIG. 1, the members would be:

Inst-Terms: M1/D, L1/PLUS, L2/PLUS
Nets: Net1
Passives: L1, L2

Parasitic Model Parameters

Model parameters describe attributes on the model. For example, for the Coupling Model from FIG. 1, the following are the model parameters and their values:

| Parameter | Value |
| --- | --- |
| modelParams | |
| dataFile | "./sParamResultFile.s2p" |
| evalType | Layout |
| evalTool | FWSolver |
| evalOptions | "FWSolver_Default" |
| evalStatus | Nil | modelParams—CDF Parameters (Component Description Format information about the cell) on the model elements. For example, for the S-Parameter block element, the dataFile represents the location of the S-Parameter Results File. (S-, or Scattering, parameters represent the electrical behavior of the electromagnetic coupling between the instances and the nets.)

evalType—The type of model evaluation: Schematic or Layout. Schematic Models are evaluated on the schematic, for example, by the user manually entering these values, whereas Layout Models are evaluated from the layout.

evalTool—The evaluation tool used for evaluating the modelParam values. FWSolver refers to the Full-Wave Solver that performs electromagnetic (EM) analysis on the Layout to generate S-Parameter values.

evalOptions—A Set of options to be used by the evalTool evalStatus—Status of evaluation: whether this model has been evaluated.

Parasitic Model Member Parameters

Member Parameters are used to describe attributes of the connections to the model. This is applicable to inst-Term and pin members. For example, the following are the member parameters on Inst-Term M1/D from the previous example:

| Parameter | Value |
| --- | --- |
| termType | Port |
| termConn | "" |
| portName | "Port_M1_D" |
| portType | Signal | termType—Whether this terminal is a "Port", "Short" or "Open". Defines the type of connection for this terminal on the Coupling Model, when inserted into the Parasitic View.

termConn—Terminal Connection when this terminal is shorted to another inst-Term (for termType=Short) or connected to an open terminal (termType—Open)

portName—This is the name of Port on the Coupling Model that this inst-Term is connected to. E.g.: "M1/D"

portType—Type of Port. E.g. "Signal" "GND".

Transfer of Layout Parasitic Models

Schematic parasitic models can be evaluated on the schematic by the user manually entering the values for these models. Layout parasitic models are however automatically evaluated from the layout, using evaluation tools. In order to evaluate parasitic models from the layout, the models with evalType=Layout are transferred from the schematic to the layout, evaluated, and then the final results can be backannotated to the schematic. This process can be illustrated with an example.

Figure 2:
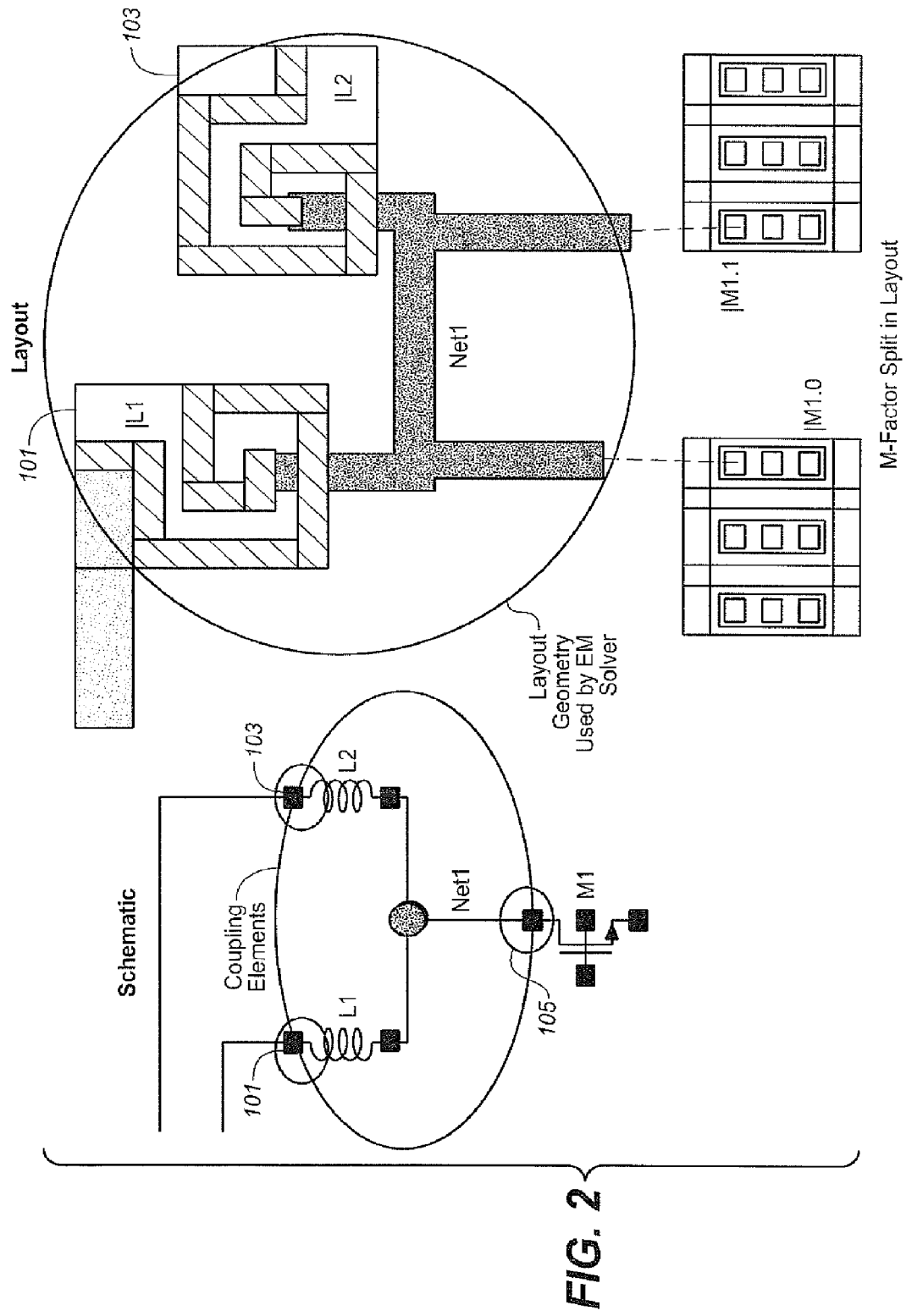
FIG. 2 illustrates layout evaluation of the coupling model.

FIG. 2 shows layout evaluation for a coupling model for the same coupling model example as in FIG. 1. The Net 1 of inductances L1 101 and L2 103 is again connected to M1 105 as shown. The right side of FIG. 2 illustrates the corresponding layout geometry associated with this example. The M-Factor is the "multiplicity factor" used for parallel multiplicity, where an instance such as M1 on the schematic maps to multiple instances (M1.0 and M1.1) on the layout. This mapping is typically provided by the layout environment. Note that the FWSolverTool (Full-Wave Solver) performs electromagnetic (EM) analysis on the layout geometry associated with Inductors "|L1", "|L2" and Net "Net1".

Figure 3:
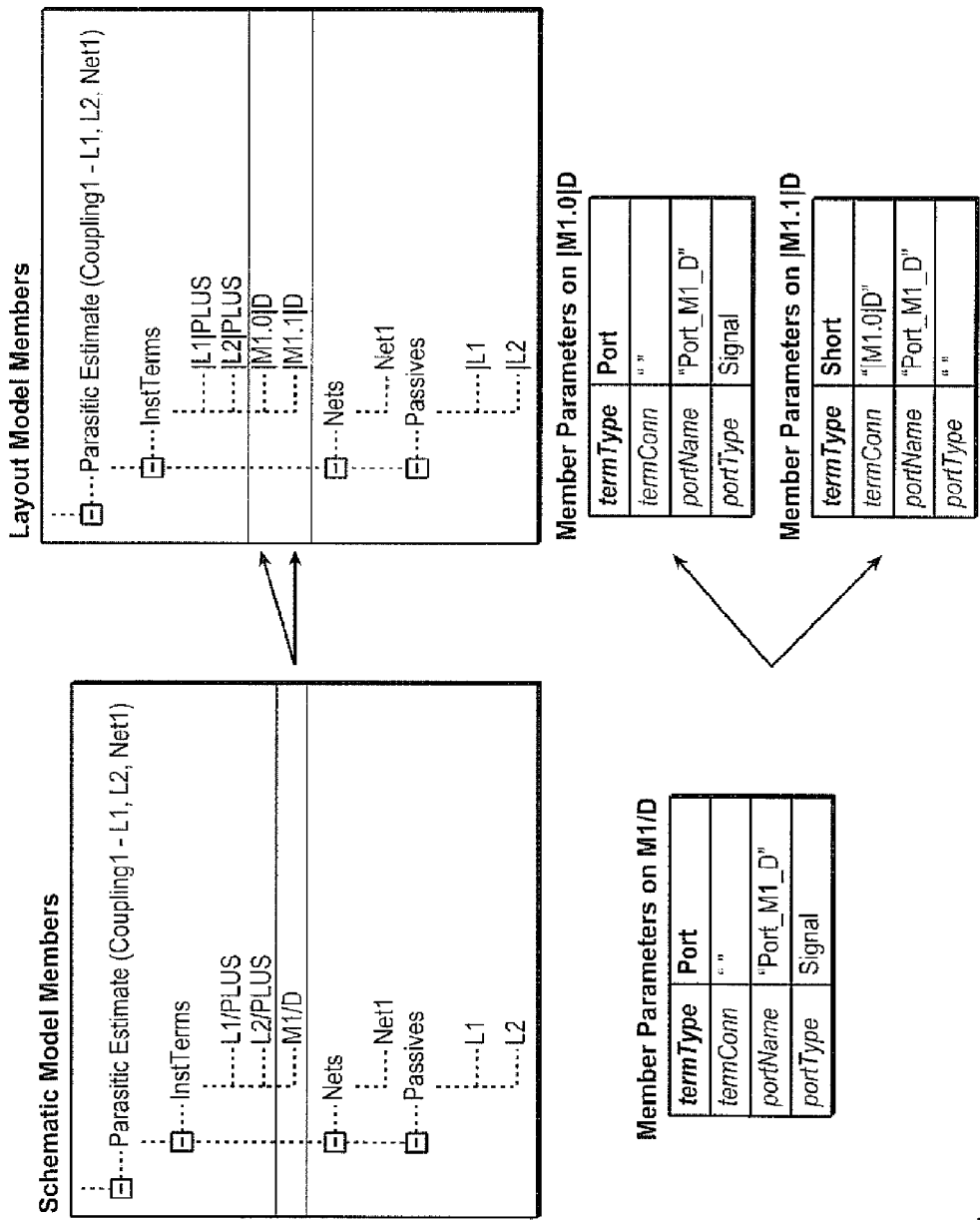
FIG. 3 illustrates transfer of a layout coupling model.

During transfer, a model is created on the layout that has a one-to-one correspondence to the model on the schematic. The members of the layout model are then updated to refer to the corresponding layout design elements using the schematic to layout mapping. Along with "L1", "L2", "Net", the inst-Term members that represent the connections/ports of the model are also transferred to the layout. In this example, the inst-Term "M1|D" on the schematic maps to multiple inst-Terms "|M1.1|D" and "M1.0|D" on the Layout. This mapping is typically provided by the layout environment. The model parameters on the schematic model are copied over to the layout model, with the member parameters on the schematic model members being transformed to member parameters on the layout model. This transformation handles the one-to-many mapping between the schematic model members and the layout model members, while keeping the model itself invariant across the transformation. For example, the number of Ports on the Coupling Model must remain the same on the schematic and the layout. This transformation is handled by converting one of the matching layout inst-Terms to a "Port" while the other inst-Terms are "Shorted" to that inst-Term and is illustrated in FIG. 3.

Model Evaluation on Layout

Once the models are available on the layout, model evaluation is performed using EvalTools. Different models can have different evaluation tools based on the type of model and the type of accuracy needed. For example, for the coupling model the FWSolver EvalTool can be used to evaluate S-Parameter values for the models. The FWSolver performs Full-Wave electromagnetic analysis.

Similarly, for star NetR and NetC, the lengths of routing (global or detailed) can be evaluated from the layout. Various approximation techniques can be used to generate values for the net-models from the lengths of the routes. For example, approximate length (L), width (W) values can be generated for the various legs of the Star-Model by averaging the lengths routes for the entire net. The L, W values are in turn converted to R, C values using technology-specific parameters.

As detailed routing information is available, simple extraction techniques can be used to generate detailed parasitic networks from the routing. These parasitic networks can then be approximated for conversion to the model. This conversion includes reduction as well as physical to logical mapping, the details of which are beyond the scope of this disclosure.

Backannotation of Parasitic Models

Once the models are evaluated, they are backannotated to the schematic, along with the values for the parameters, thereby permitting a user to mix and match models evaluated on the layout, with those evaluated on the schematic. The designers can backannotate models from partial layouts to the schematic. They are not limited to a single layout; instead they can mix and match parts of layouts from multiple layout sources to the same schematic. Further, schematic parasitic models, originally evaluated on the schematic can also be converted to layout models, transferred to the layout, evaluated on the layout and then backannotated back to the schematic.

Once the models are available on the schematic, designers can use existing techniques to simulate the design with Parasitics. For example, they can create an Estimated Parasitic View, which is a schematic view that is created by flattening the original schematic hierarchy and copying the instances over. The critical nets are then replaced by parasitic elements representing Star RC schematic parasitic models. They can then update the tests to point to the estimated parasitic view and perform simulations with parasitics. The overall flow is illustrated in FIG. 4.

Figure 4:
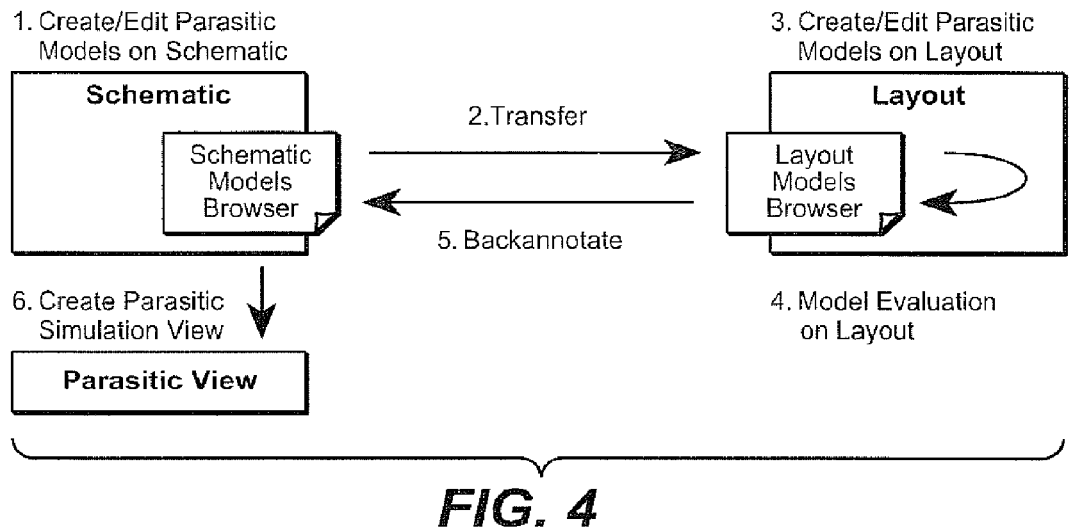
FIG. 4 shows the overall flow for the exemplary embodiment.

FIG. 4 is the overall flow in the exemplary embodiment, which includes both the model evaluation from layout aspects and the backannotation aspects. Beginning with the user creating or editing parasitic models on the schematic using the schematic models browser, it is transferred to the layout. The user can then create or edit the parasitic models on the layout using the layout models browser, followed by the model evaluation on the layout. The result is then backannotated to the schematic and the parasitic simulation view is created. Note that although the exemplary embodiment combines model evaluation from layout and backannotation of models from layout, more generally these aspects can be used independently. For instances, the user could enter model parameters on the layout environment by hand, which could then be backannotated.

Parasitics Mode Toolbar

The next sections relate to parasitic aware circuit design using modes of varying accuracy. In the exemplary embodiment, a parasitics mode toolbar is made available in the simulation environment. Users can easily switch back-and-forth between various analyses during the circuit design process and compare the results of simulations without parasitics with those of simulations with parasitics of varying levels of accuracy.

Figure 5:
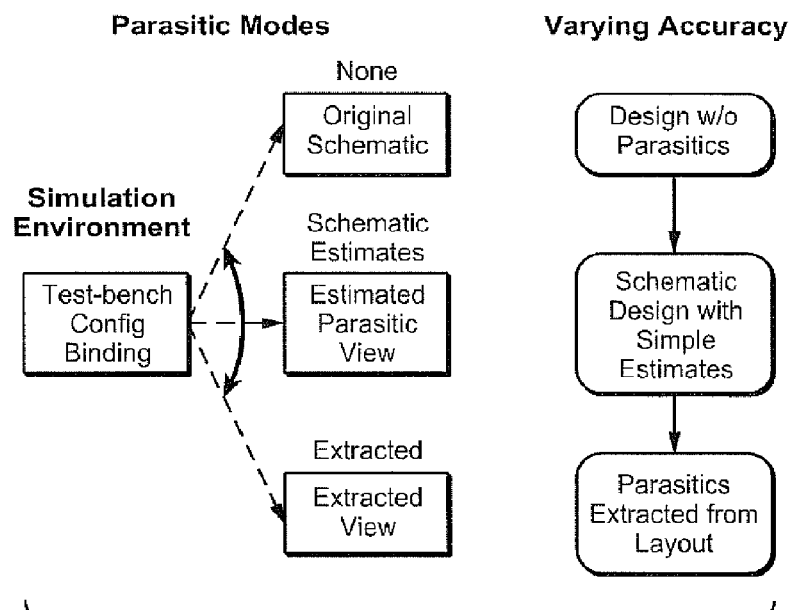
FIGS. 5 and 6 show the various parasitic modes in the simulation environment.

FIG. 5 illustrates some examples of the various parasitic modes in the simulation environment and their corresponding degrees of accuracy. Switching the modes updates the simulation test bindings. In this exemplary embodiment, the shown modes are:

None Mode: In this mode, the circuit is simulated without parasitics. The results from these simulations can be used to compare with those from simulations with parasitics to analyze the impact of parasitics on the circuit performance. The tests in this stage are bound to the original schematic design. User is free to bind their test configurations manually, but no support is given for sweeping parasitics or optimizing in the presence of parasitics.

Schematic Estimates Mode: Early in the design cycle, parasitic estimate values may be generated by the user on the schematic, for example, using equation-based approximation techniques. Test configurations are automatically bound to estimated view.

Extracted Mode: This mode is used when information about the parasitics can be extracted from a layout. Early in the design cycle, such information can be extracted from layout previously completed on similar designs. Test configurations are automatically bound to the extracted view.

Figure 6:
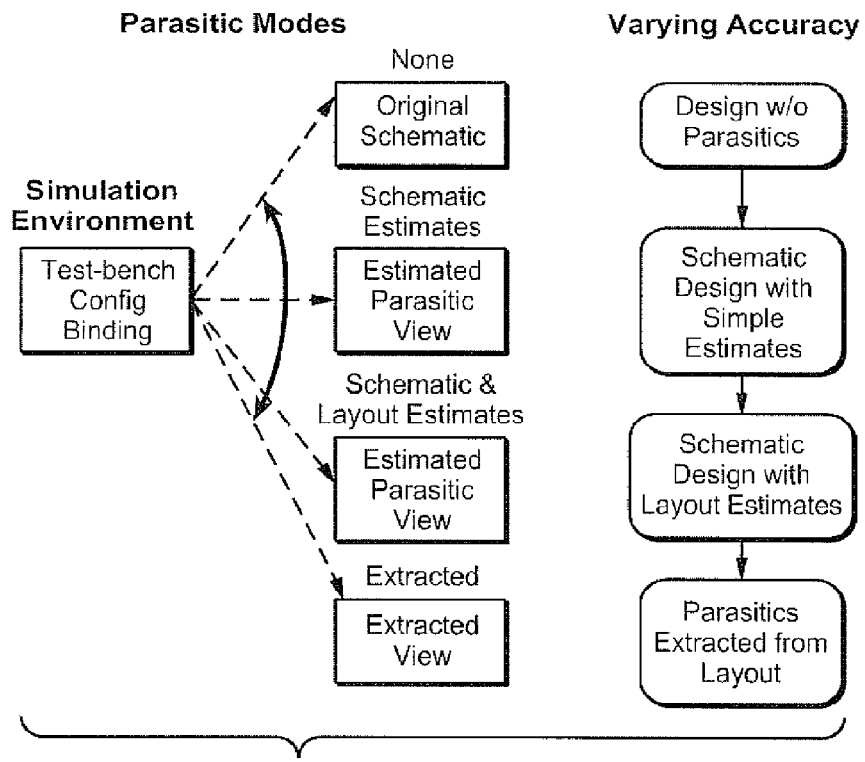
Figure 12:
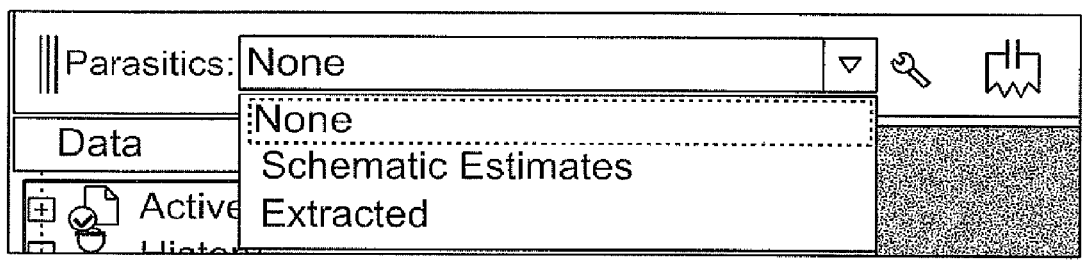
FIG. 12 is an example of a Parasitic Mode Toolbar.

FIG. 12 is a snapshot showing an example of how a parasitic mode toolbar in simulation and layout environments. This mode toolbar shows the various modes of FIG. 5 and how the user can switch between the various modes. The use of layout estimates, as discussed in preceding section can also be incorporated as one of the multiple modes that include parasitics and is shown in FIG. 6, as the Schematic and Layout Estimates Mode, where the schematic design will now include layout estimates.

Automatic Simulation Test Update

When a user switches modes, all instances of the design in each test can be rebound to the parasitic view. The original bindings in the config are saved so they can be restored later, on leaving the parasitic mode. In particular, on switching to "None" or "No Parasitics", the tests are rebound to the state they were in before entering any parasitic mode.

Figure 7:
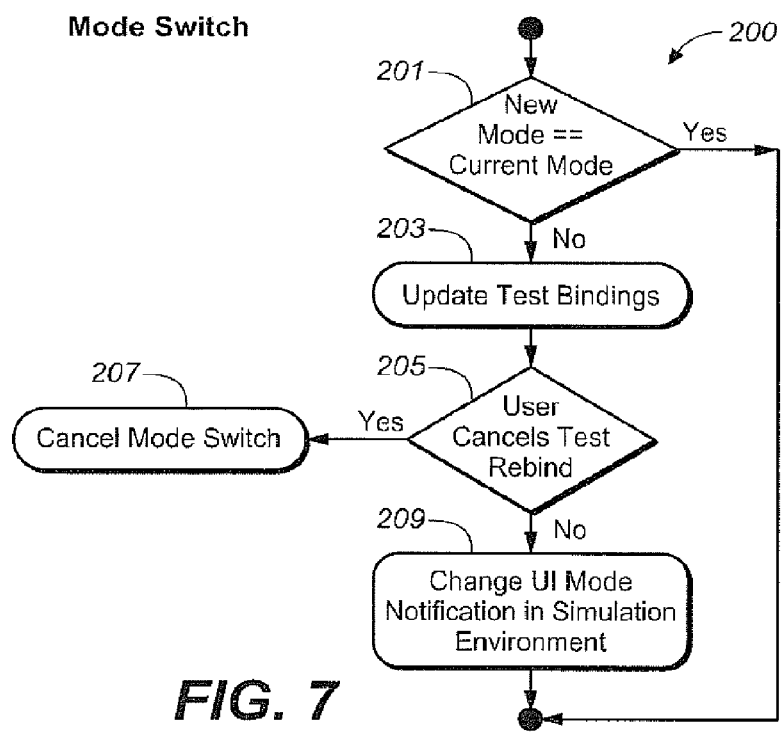
FIG. 7 illustrates a mode switch and the automatic updating process.

FIG. 7 illustrates the relationship between the various user actions during a mode switch and the automatic update of test bindings. The process 200 begins at 201, where it is determined whether the user has switched modes, with the other elements of FIG. 7 being skipped if the mode stays the same. When the mode has been changed, the test bindings are updated at 203, after which the user can cancel the test rebind at 205. If cancelled, this flow leads to 207; otherwise, at 209 the change in the user interface mode notification is made in the simulation environment.

Figure 8:
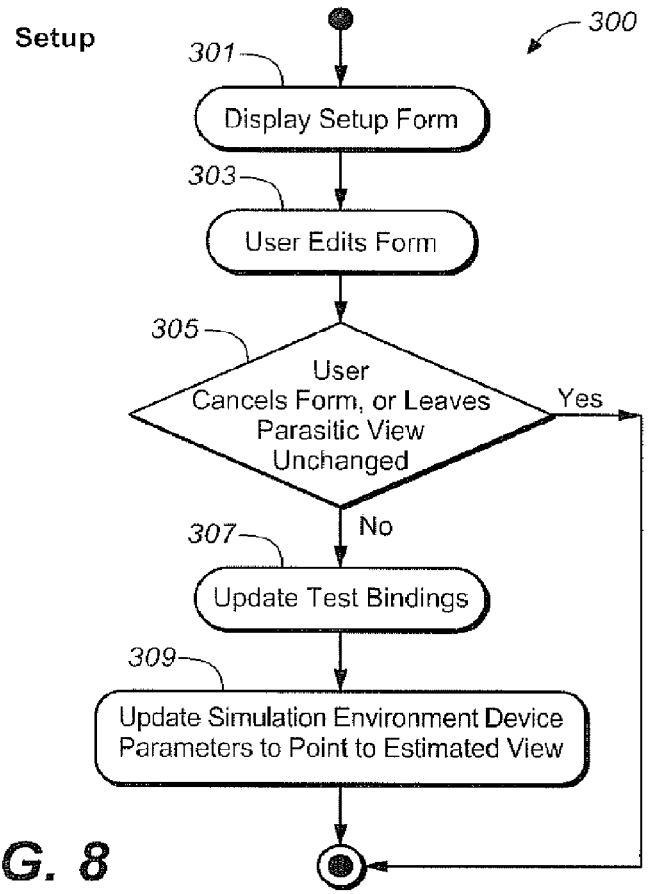
FIG. 8 illustrates user actions and their impact on the automated test bindings, as well as the re-creation of the estimated view.

The design library/cell and parasitic view can be set in the parasitic mode setup. This setup information is saved for each parasitic mode. The corresponding user actions and their impact on the automated test bindings, as well as the re-creation of the estimated view, are illustrated in FIG. 8 in process 300. After the setup form is displayed (301), it can be edited by the user at 303. The user can then cancel the form or leave the parasitic view unchanged, at 305, or continue to update the test bindings at 307. After the test binding is updated, 309 updates the simulation environment device parameters to point to the estimated view.

Figure 9:
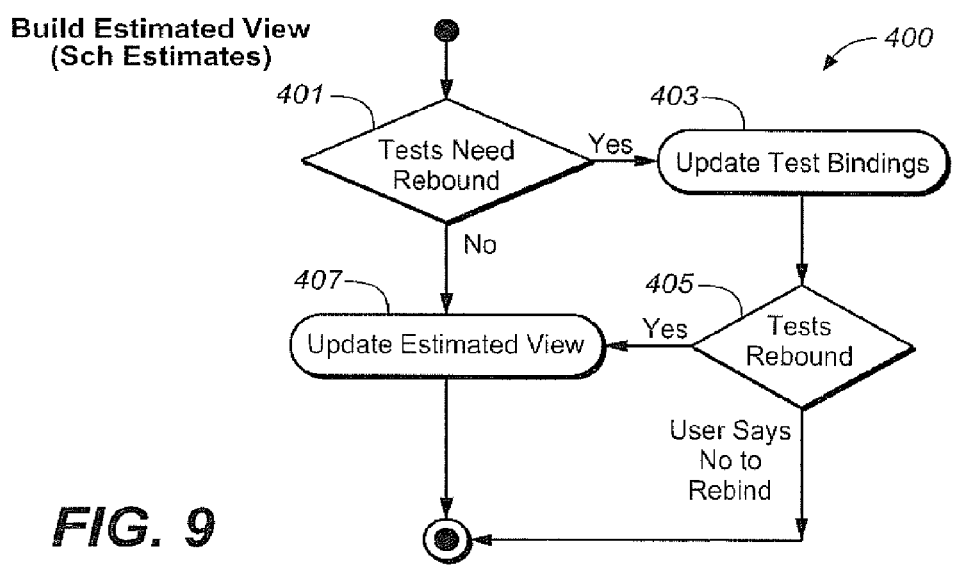
FIG. 9 illustrates the interactions between the Build Estimated View User Action, the update of test bindings and the update of the estimated view.

Toolbar buttons can allow the user to build the estimated view from the parasitic models specified on the schematic. When building the estimated view, all simulation parameters can be updated to be in sync with the parasitic models. The process 400 of FIG. 9 illustrates the interactions between the Build Estimated View User Action, the update of test bindings and the update of the estimated view. At 401, the tool can decide whether the tests need to be rebound; if not, the estimated view is updated at 407. If rebinding is needed, it is performed at 403, after which (at 405) the user can accept the rebinding, leading to the updated at 407, or decline the rebind.

Figure 10:
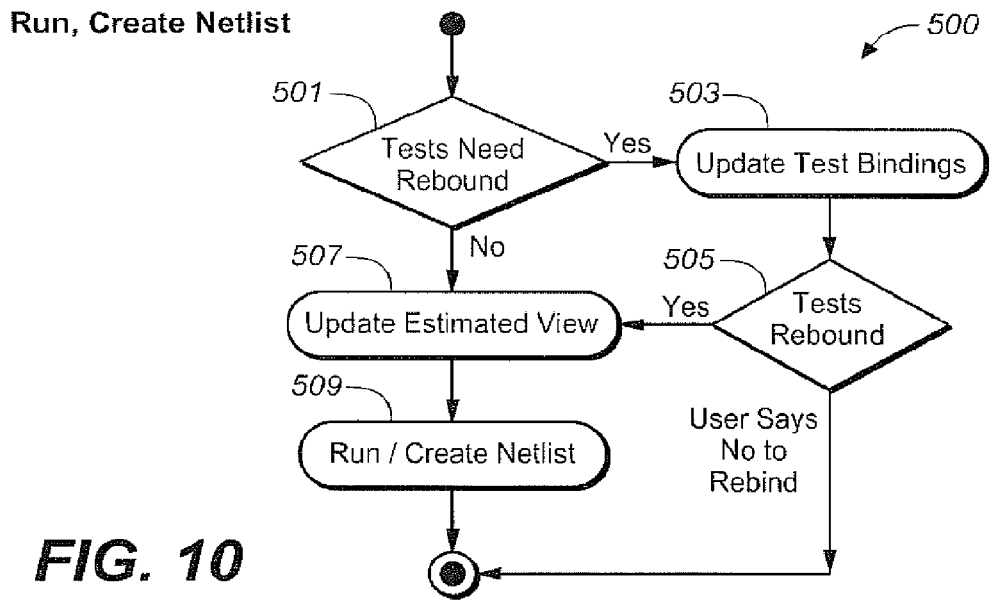
FIGS. 10 and 11 illustrate the incorporation of Run and Create Netlist.

The simulation environment provides various user operations such as "Run" and "Create Netlist": "Run" will run the simulations using various tests; "Create Netlist" will create the simulation netlist corresponding to a combination of the test and the design circuit. Process 500 of FIG. 10 illustrates the interactions between the user actions: Run and Create Netlist, the update of test bindings and the update of the estimated view. FIG. 10 is similar to FIG. 9, but Update Estimated View (507) now leads to Run/Create Netlist/509. On pressing the Run button, if the parasitic models have been edited since the last build operation, the estimated view is re-built.

Figure 11:
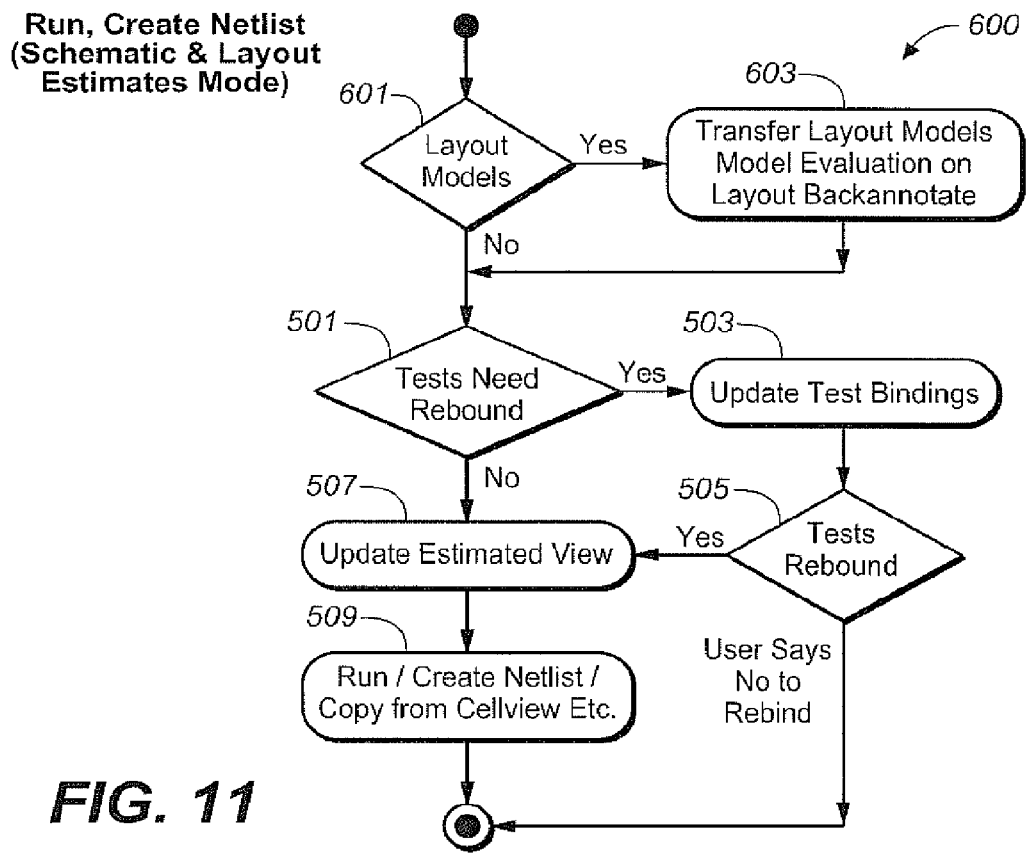

FIG. 11 illustrates the interactions between the user actions in the schematic and layout estimates mode, when it is included as in FIG. 6. Prior to 501 of the process 600, the users can now choose to go to layout models at 601, leading to the various actions presented in the earlier sections, including the transfer of layout models, model evaluation on layout, and backannotation.

Device and Parasitic Parameters

During user actions like Run and Create Netlist, all device parameters are updated for the duration of simulation. Examples can include: updating the location to point to the estimated view; mapping device names between hierarchical and flat namespaces. On completion, the device parameters will be updated to point back to the schematic. Any extra copies will be deleted.

The exemplary embodiment introduces a new category of parameters in the simulation environment that will allow parasitic model parameters to be swept. These simulation parameters are created automatically when building an estimated view. There is a one-to-one correspondence between the simulation parameters and the parasitic model parameters. In addition to scalar values for these parameters, users can specify a range using the same syntax as device parameters. When running the simulations in schematic estimates modes, users have a choice of sweeping design parameters, parasitic parameters, or both. Outside the estimates modes parasitic parameters are disabled and only device parameters can be swept.

CONCLUSION

While the above embodiments have been described in the context of analog/mixed-signal circuits, those skilled in this art may extend the techniques for use with other fields as well. For example, one may provide similar capabilities in simulation and layout environments for Chip Integration, System-In-Package or Board-Level designs.

Many aspects of the methods of the present invention will most commonly be implemented in software as a set of instructions for a computer program product, although many of these can be implemented in hardware or by a combination of software and hardware. For instance, FIG. 17 is an example of a presentation on a display of a computer system running such a software product. Further, the different operations described may be executed in various orders, or using different specific products, other than those of the embodiments while still maintaining various aspects of the present invention. As will be understood in the art, the invention or components thereof may be embodied in a fixed media program component containing logic instructions and/or data that when loaded into an appropriately configured computing device cause that device to perform according to the embodiments of the invention. As will be understood in the art, a fixed media program may be delivered to a user on a fixed media for loading in a user's computer or a fixed media program can reside on a remote server that a user accesses through a communication medium in order to download a program component. Examples of such fixed media include a disk-type optical or magnetic media, magnetic tape, solid state memory, etc. Embodiments of the invention may be embodied in whole or in part as software recorded on this fixed media.

Although the various aspects of the present invention have been described with respect to certain embodiments, it is understood that the invention is entitled to protection within the full scope of the appended claims.

It is claimed:

1. In an automated design process for an integrated circuit, a method comprising:
    using a computer to present a user with a simulation environment;
    within the simulation environment, providing the user with a choice to select between parasitic simulation modes of varying accuracy, said modes including a mode without parasitic and a plurality of modes including parasitics with a varying degree of accuracy;
    wherein said mode without parasitics includes a schematic mode representation of the circuit;
    wherein at least one of said modes that includes parasitics includes a schematic mode representation of the circuit having parasitic estimate values generated on the schematic of the circuit using layout estimates; and
    wherein at least one of said modes that includes parasitics includes a layout mode representation of the circuit in which an approximation of parasitics is extracted from a layout representation of the circuit;
    receiving a selection from the user from among said modes;
    in response to a user selection that includes a layout mode representation of a portion of the circuit that includes one or more nets and instances connected to the one or more nets, producing a coupling model for use in the layout representation of the circuit that models parasitic coupling interactions between the one or more nets and the instances connected to the one or more nets;
    wherein producing the coupling model includes receiving an indication from the user of one or more attributes of connection of the coupling model to the layout representation of the circuit; and
    performing simulation tests for the circuit at the selected degree of accuracy.

2. The method of claim 1, wherein said choice to select between parasitic simulation modes is provided to the user as a toolbar on the simulation environment.

3. The method of claim 1, wherein the simulation environment is presented to the user in response to the user switching modes.

4. The method of claim 3, wherein, in response to the user switching modes, the design process automatically converts tests in the simulation environment to point to parasitic simulation views.

5. The method of claim 3, wherein, in response to the user switching modes, the design process automatically maps device parameters from a schematic to estimated views.

6. The method of claim 5, wherein the design process includes a category of parameters in the simulation environment that correspond to parasitic model parameters.

7. The method of claim 6, wherein said category of parameters in the simulation environment are swept together when performing said simulation tests.

8. The method of claim 7, wherein said category of parameters in the simulation environment are optimized together when performing said simulation tests.

9. The method of claim 1, wherein said modes including parasitics include a mode having parasitic estimate values generated by the user on a schematic of the circuit.

10. A computer program product to perform an automated integrated circuit design process, including a non-transitory medium storing executable instructions, the computer program product comprising instructions for performing a process including the method of claim 1.

11. The computer program product of claim 10, wherein the simulation environment is presented to the user in response to the user switching modes.

12. The computer program product of claim 11, wherein, in response to the user switching modes, the design process automatically converts tests in the simulation environment to point to parasitic simulation views.

13. The computer program product of claim 11, wherein, in response to the user switching modes, the design process automatically maps device parameters from a schematic to estimated views.

14. A system for a design process of an integrated circuit, comprising:
 a user interface for viewing representations of the integrated circuit on a display; and at least one processing unit including circuitry to a perform an automated process including the method of claim 1.

15. The system of claim 14, wherein the simulation environment is presented to the user in response to the user switching modes.

16. The system of claim 15, wherein, in response to the user switching modes, the design process automatically converts tests in the simulation environment to point to parasitic simulation views.

17. The system of claim 15, wherein, in response to the user switching modes, the design process automatically maps device parameters from a schematic to estimated views.

\* \* \* \* \*